(12) United States Patent
Wu et al.

(10) Patent No.: US 12,712,506 B2
(45) Date of Patent: Aug. 18, 2026

(54) THRESHOLD VOLTAGE SENSOR AND A CHIP USING THE THRESHOLD VOLTAGE SENSOR

(71) Applicant: MEDIATEK INC., Hsinchu City (TW)

(72) Inventors: Wan-Ling Wu, Hsinchu City (TW); Hung-Chieh Tsai, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 555 days.

(21) Appl. No.: 18/326,136

(22) Filed: May 31, 2023

(65) Prior Publication Data

US 2024/0223142 A1 Jul. 4, 2024

Related U.S. Application Data

(60) Provisional application No. 63/477,564, filed on Dec. 29, 2022.

(51) Int. Cl.
*H03F 3/45* (2006.01)

(52) U.S. Cl.
CPC ..... *H03F 3/45475* (2013.01); *H03F 3/45273* (2013.01); *H03F 2200/471* (2013.01)

(58) Field of Classification Search
CPC ............. H03F 3/45475; H03F 3/45273; H03F 2200/471; G05F 3/262; G05F 3/205
USPC .......................................................... 330/252
See application file for complete search history.

(56) References Cited

U.S. PATENT DOCUMENTS 7,847,629 B2 * 12/2010 Chou .................. G11C 27/026 330/277
8,350,555 B2 1/2013 Kim et al.
9,436,195 B2 9/2016 Sano et al.
2005/0248392 A1 11/2005 Jung
2019/0120699 A1 4/2019 Wang

FOREIGN PATENT DOCUMENTS

TW 201003357 A 1/2010
TW 201413416 A 4/2014
TW 202223583 A 6/2022

OTHER PUBLICATIONS

BJT vs FET (Transistors) "All About Electronics" (Year: 2018).*
Extended European Search Report dated Mar. 27, 2024, issued in application No. EP 23200643.7.

(Continued)

*Primary Examiner* — Andrea Lindgren Baltzell
*Assistant Examiner* — Nareh Shamiryan
(74) *Attorney, Agent, or Firm* — McClure, Qualey & Rodack, LLP

(57) ABSTRACT

A low-cost and high-accuracy threshold voltage (Vth) sensor is shown. In addition to a current mirror implemented by an operational amplifier and two metal-oxide-semiconductor field-effect transistors (MOSFETs), the Vth sensor uses an active device and a diode-connected MOSFET. The active device is provided to determine a constant current that is mirrored from the first MOSFET to the second MOSFET of the current mirror. The diode-connected MOSFET is coupled between the drain terminal of the second MOSFET and the ground terminal. The constant current flows through the diode-connected MOSFET to generate an output voltage that contains information about a threshold voltage (Vth) of a MOSFET.

17 Claims, 8 Drawing Sheets

(56) References Cited

OTHER PUBLICATIONS

Sundaresan, K., et al.; "Process and temperature compensation in a 7-MHz CMOS clock oscillator;" IEEE Journal of Solid-State Circuits; vol. 41; No. 2; Feb. 2006; pp. 433-442.
Alini, R., et al.; "Accurate MOS threshold voltage detector for bias circuitry;" ISCAS; May 1992; pp. 1280-1283.

* cited by examiner

THRESHOLD VOLTAGE SENSOR AND A CHIP USING THE THRESHOLD VOLTAGE SENSOR

CROSS REFERENCE TO RELATED APPLICATIONS

This application claims the benefit of U.S. Provisional Application No. 63/477,564, filed Dec. 29, 2022, the entirety of which is incorporated by reference herein.

BACKGROUND OF THE INVENTION

Field of the Invention

The present invention relates to process sensors, and, in particular, to threshold voltage (Vth) sensors.

Description of the Related Art

Process sensors are provided to deal with PVT (process, voltage, and temperature) variations. Many analog characteristics (noise, speed, gain, etc.) are related to the transconductance (gm) of a device. The device transconductance (gm) is typically estimated by a threshold voltage (Vth) sensor. A low-cost, joint-effect free Vth sensor is called for.

BRIEF SUMMARY OF THE INVENTION

A low-cost and high-accuracy threshold voltage (Vth) sensor not affected by resistor variations and mobility variations is shown.

A threshold voltage sensor in accordance with an exemplary embodiment of the present invention has a first metal-oxide-semiconductor field-effect transistor (MOSFET), a second MOSFET, an operational amplifier, an active device, and a diode-connected MOSFET. The operational amplifier has an output terminal coupled to a gate terminal of the first MOSFET and a gate terminal of the second MOSFET, a first input terminal receiving a first constant voltage, and a second input terminal coupled to the drain terminal of the first MOSFET. The active device is coupled between the drain terminal of the first MOSFET and a ground terminal to determine a constant current that is mirrored from the first MOSFET to the second MOSFET. The diode-connected MOSFET is coupled between the drain terminal of the second MOSFET and the ground terminal. The constant current flows through the diode-connected MOSFET to generate an output voltage that contains information about a threshold voltage of a MOSFET.

In an exemplary embodiment, the active device comprises a third MOSFET coupled between the drain terminal of the first MOSFET and the ground terminal, and the third MOSFET has a gate terminal biased by a second constant voltage.

In an exemplary embodiment, the third MOSFET and the diode-connected MOSFET have the same length-to-width ratio.

In an exemplary embodiment, the threshold voltage sensor further comprises a fourth MOSFET coupled in series with the diode-connected MOSFET. The fourth MOSFET has a gate terminal biased by a third constant voltage.

In an exemplary embodiment, the threshold voltage sensor further comprises a fifth MOSFET coupled in series with the third MOSFET. The fifth MOSFET has a gate terminal biased by a fourth constant voltage.

In an exemplary embodiment, the third, fourth, and fifth MOSFETs are n-channel MOSFETs (NMOSs). The diode connected MOSFET is implemented by an NMOS and is coupled between the source terminal of the fourth MOSFET and the ground terminal. The first bias voltage, second bias voltage, third bias voltage, and fourth bias voltage make the third MOSFET, the fourth MOSFET, and the diode-connected MOSFET operating in a saturation region, and the fifth MOSFET operating in a linear region. All non-ideal process factors are removed from the sensed threshold voltage.

In an exemplary embodiment, the third and fourth MOSFETs are NMOSs, and the fifth MOSFET is a p-channel MOSFET (PMOS). The diode connected MOSFET is implemented by a PMOS and is coupled between the source terminal of the fourth MOSFET and the ground terminal. The first bias voltage, second bias voltage, third bias voltage, and fourth bias voltage make the third MOSFET, the fourth MOSFET, and the diode-connected MOSFET operating in a saturation region, and the fifth MOSFET operating in a linear region. All non-ideal process factors are removed from the sensed threshold voltage.

In an exemplary embodiment, a chip with the proposed threshold voltage sensor is shown. The chip using the proposed threshold voltage sensor has an analog block, an analog-to-digital converter, and a digital signal processor. The threshold voltage sensor is placed within a surrounding area of the analog block. The analog-to-digital converter converts the output voltage generated by the threshold voltage sensor to a digital value. The digital signal processor performs a calibration process for the analog block based on the digital value.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

A low-cost and high-accuracy threshold voltage (Vth) sensor not affected by resistor and mobility variations is shown. In addition to a current mirror implemented by an operational amplifier and two metal oxide-semiconductor field-effect transistors (MOSFETs), the Vth sensor uses an active device and a diode-connected MOSFET. The active device is provided to determine a constant current that is mirrored from the first MOSFET to the second MOSFET of the current mirror. The diode-connected MOSFET is coupled between the drain terminal of the second MOSFET and a ground terminal. The constant current flows through the diode-connected MOSFET, and thereby an output voltage containing information about a threshold voltage (Vth) of a MOSFET is generated. Because of the active device and the diode-connected MOSFET, the resistor and mobility variations are removed from the sensed Vth.

Unlike passive devices that can be seriously affected by process variations, the active device is stable. Thus, the more accurate Vth is sensed.

Figure 1:
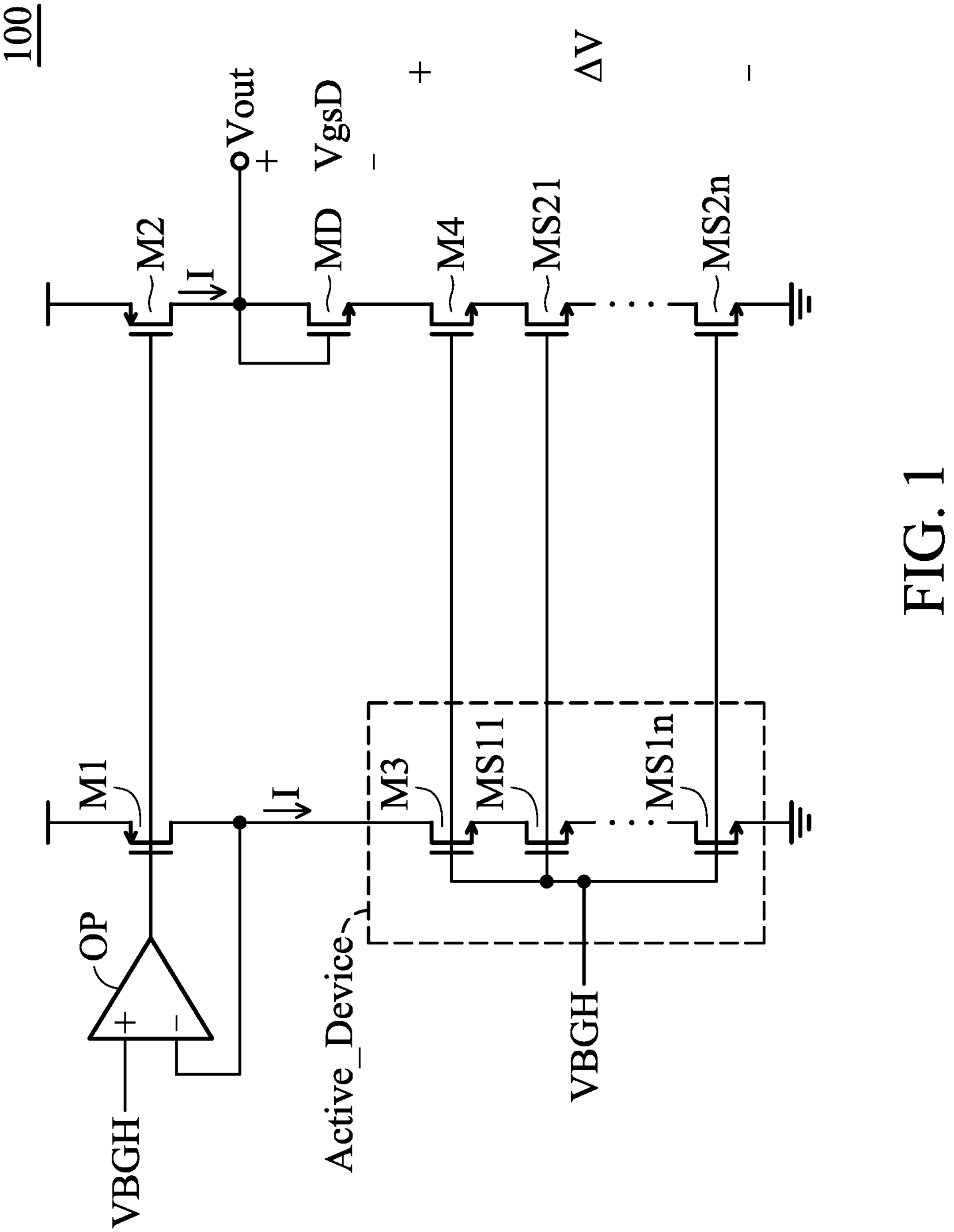
FIG. 1 illustrates a Vth sensor 100 in accordance with an exemplary embodiment of the present invention.

FIG. 1 illustrates a Vth sensor 100 in accordance with an exemplary embodiment of the present invention. The Vth sensor 100 uses a first metal-oxide-semiconductor field-effect transistor (MOSFET) M1, a second MOSFET M2, and an operational amplifier OP to form the current mirror for sensing the threshold voltage (Vth) of MOSFET. The operational amplifier OP has an output terminal coupled to a gate terminal of the first MOSFET M1 and a gate terminal of the second MOSFET M2, a first input terminal '+' receiving a constant voltage VBGH (e.g., a bandgap reference voltage), and a second input terminal '−' coupled to the drain terminal of the first MOSFET M1. The Vth sensor 100 provides an active device Active_Device between the drain terminal of the first MOSFET M1 and the ground terminal to determine the constant current I that is mirrored from the first MOSFET M1 to the second MOSFET M2. The active device Active_Device includes MOSFETs connected in series.

As shown, the active device Active_Device has a third MOSFET M3 coupled between the drain terminal of the first MOSFET M1 and the ground terminal. The active device Active_Device further comprises a first series of MOSFETs MS11 . . . MS1*n* coupled between the source terminal of the third MOSFET M3 and the ground terminal. Note that no passive elements are placed between the drain terminal of the first MOSFET M1 and the ground terminal. Thus, the generated constant current I is not affected by the passive process variations. The sensed Vth (dependent on the constant current I), thus, is accurate. The first series of MOSFETs MS11 . . . MS1*n* are provided to suppress the power consumption.

The Vth sensor 100 further has a diode-connected MOSFET MD coupled between the drain terminal of the second MOSFET M2 and the ground terminal. In an exemplary embodiment, the third MOSFET M3 and the diode-connected MOSFET MD have the same length-to-width ratio. The diode-connected MOSFET MD is provided to eliminate the mobility variation from the sensed Vth.

The Vth sensor 100 further has a fourth MOSFET M4 coupled in series with the diode-connected MOSFET MD. The Vth sensor 100 further has a second series of MOSFETs MS21 to MS2*n* coupled between the source terminal of the fourth MOSFET M4 and the ground terminal. The drain terminal of the second MOSFET M2 is coupled to the drain terminal of the fourth MOSFET M4 through the diode-connected MOSFET MD. In an exemplary embodiment, the MOSFETs M4 and MS21~MS2*n* have the same size structure as the MOSFETs M3 and MS11~MS1*n*, for elimination of non-ideal factors.

In FIG. 1, the same constant voltage VBGH is tied to the gate of the third MOSFET M3, the gate terminals of the first series of MOSFETs MS11~MS1*n*, the gate terminal of the fourth MOSFET M4, and the gate terminals of the second series of MOSFETs MS21~MS2*n*. In this example, the third MOSFET M3 and the fourth MOSFET M4 are operated in a saturation region. The output voltage Vout is: Vout=VgsD+ΔV, where VgsD is a function of Vth and a process factor λ. The output voltage Vout containing information about the threshold voltage Vth still contains the non-ideal factor λ.

Figure 2:
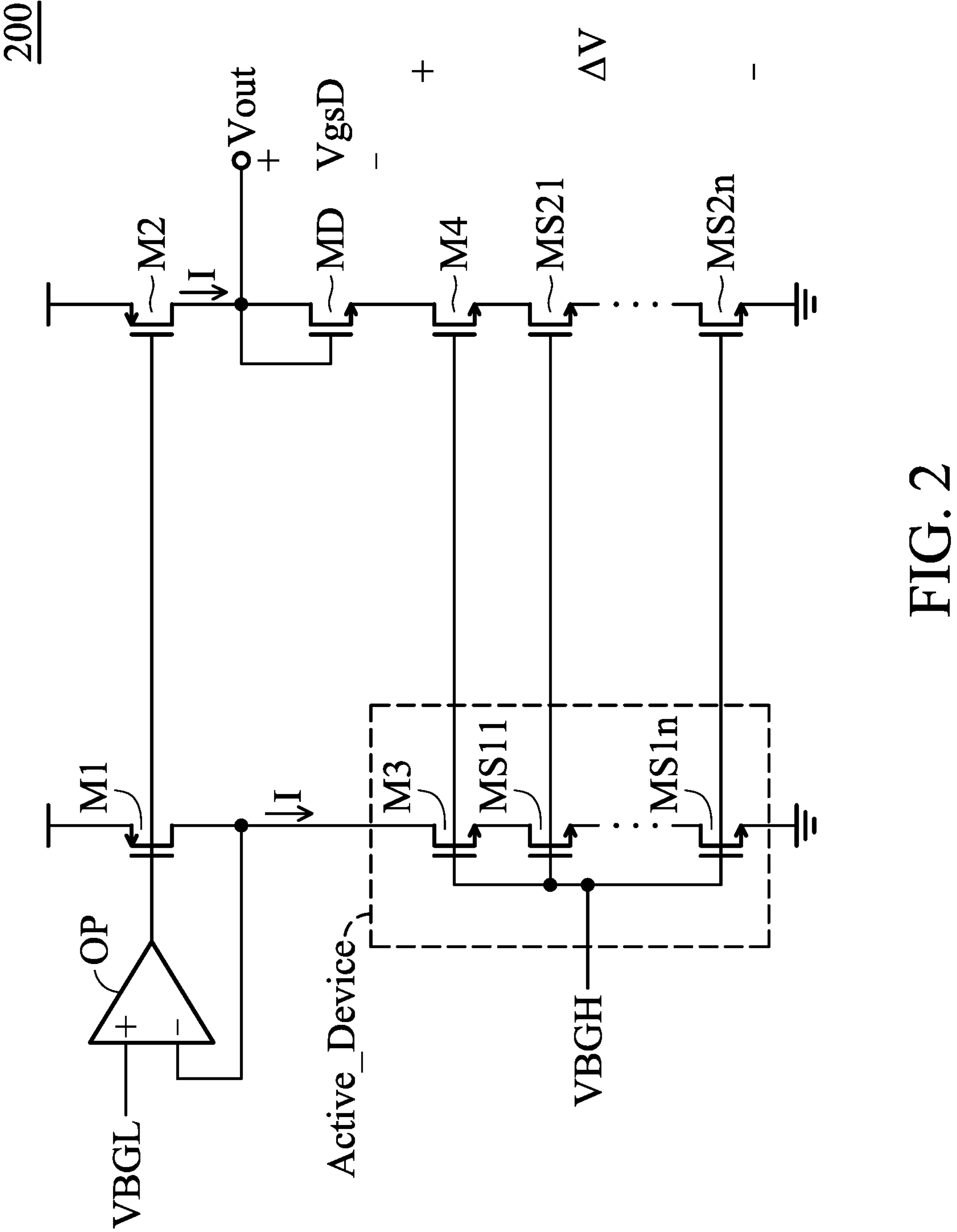
FIG. 2 illustrates a Vth sensor 200 in accordance with another exemplary embodiment of the present invention.

FIG. 2 illustrates a Vth sensor 200 in accordance with another exemplary embodiment of the present invention. The circuit structure of the Vth sensor 200 is the same as the circuit structure of the Vth sensor 100. However, the Vth sensors 100 and 200 have the different bias designs. The first input terminal '+' of the operational amplifier OP is biased by another constant voltage VBGL (e.g., another bandgap reference voltage lower than VBGH). The gate of the third MOSFET M3, the gate terminals of the first series of MOSFETs MS11~MS1*n*, the gate terminal of the fourth MOSFET M4, and the gate terminals of the second series of MOSFETs MS21~MS2*n* are biased by the same constant voltage VBGH. The third MOSFET M3 and the fourth MOSFET M4 are operated in a linear region. The output voltage Vout is: Vout=VgsD+ΔV, where VgsD is a function of Vth and is irrelevant to any other process factors. Thus, the sensed Vth is in high accuracy. In an exemplary embodiment, the bandgap reference voltage VBGL is 0.2V, and the bandgap reference voltage VBGH is 0.9V.

Figure 2A:
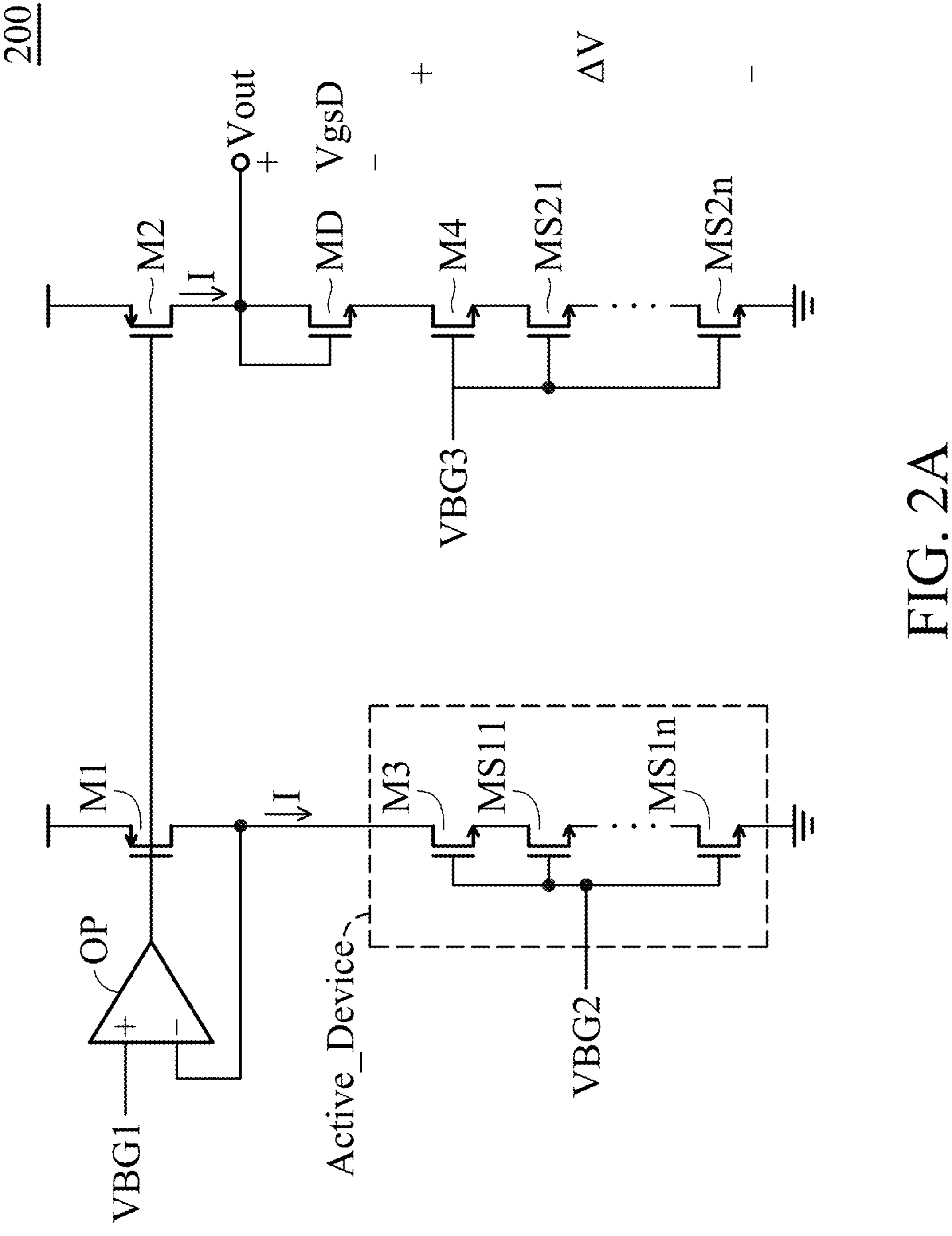
FIG. 2A is a circuit diagram illustrating a variation of the MOS biasing circuit shown in FIG. 2, according to another embodiment of the present disclosure.

Reference is now made to FIG. 2A, which illustrates an alternative embodiment of the MOS biasing design. The embodiment of FIG. 2A is similar to that of FIG. 2, except that while a constant voltage VBG1 is used to bias the operational amplifier OP, gate terminals of the first series of MOSFETs MS11~MSIn are biased by a constant voltage VBG2 that also bias the while a constant voltage VBG1 is used to bias the operational amplifier OP, and the gate terminals of the second series of MOSFETs MS21~MS2*n* are biased by a constant voltage VBG3 that also bias the fourth MOSFET M4.

Figure 3A:
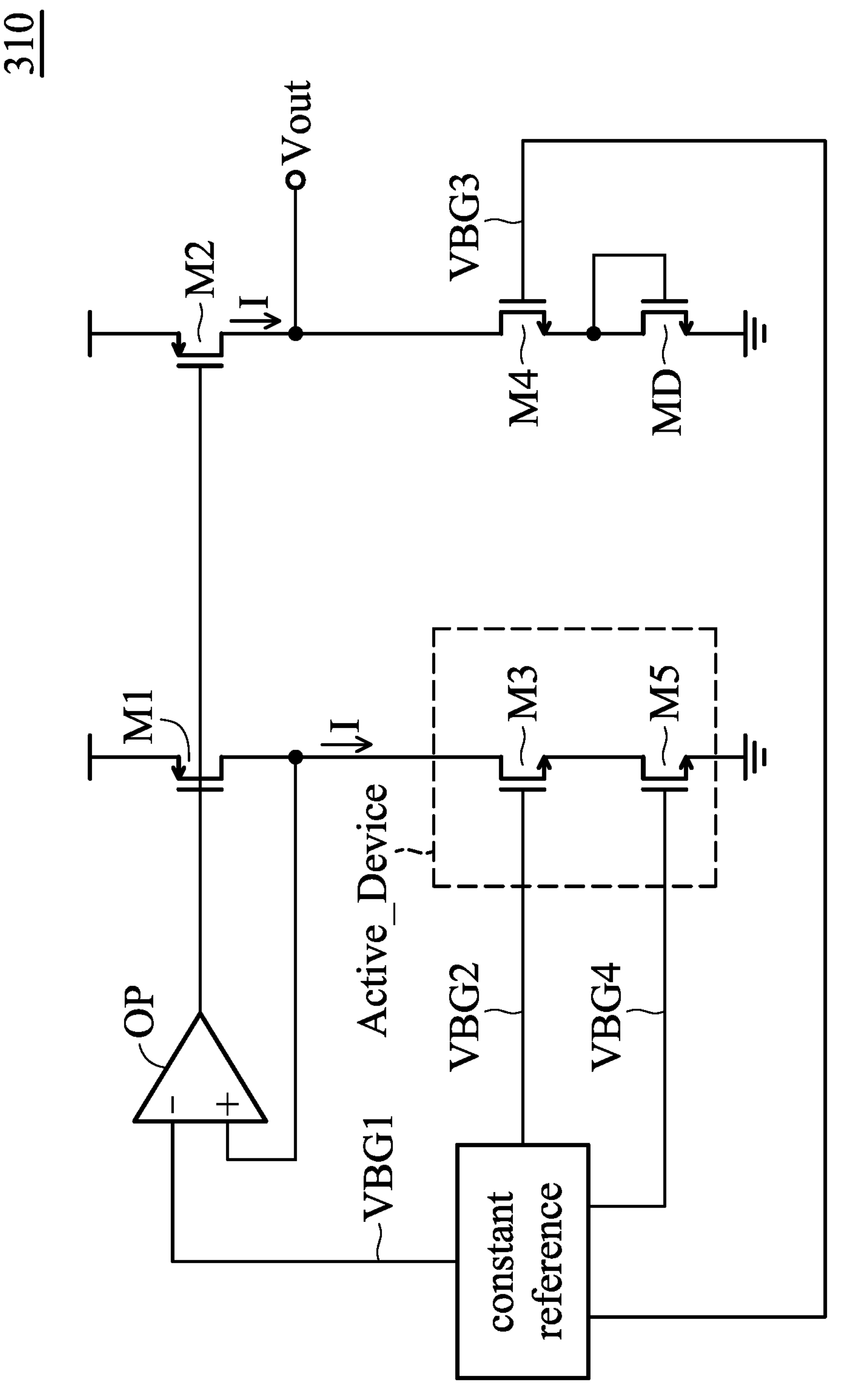
FIG. 3A illustrates a Vth sensor 310 in accordance with another exemplary embodiment of the present invention.

FIG. 3A illustrates a Vth sensor 310 in accordance with another exemplary embodiment of the present invention. In FIG. 3A, the active device Active_Device has the third MOSFET M3 and a fifth MOSFET M5. The fifth MOSFET M5 is coupled in series with the third MOSFET M3. The fifth MOSFET M5 is an n-channel MOSFET (NMOS), the third MOSFET M3 and fourth MOSFET M4 are NMOSs, and the diode connected MOSFET MD is implemented by an NMOS. The diode connected MOSFET MD is coupled between the source terminal of the fourth MOSFET M4 and the ground terminal. The constant voltages VBG1~VBG4 used in the Vth sensor 310 make the third MOSFET M3, the fourth MOSFET M4, and the diode-connected MOSFET MD operating in a saturation region, and the fifth MOSFET M5 operating in a linear region. This structure also successfully eliminate the non-ideal factor λ from the sensed Vth.

Figure 3B:
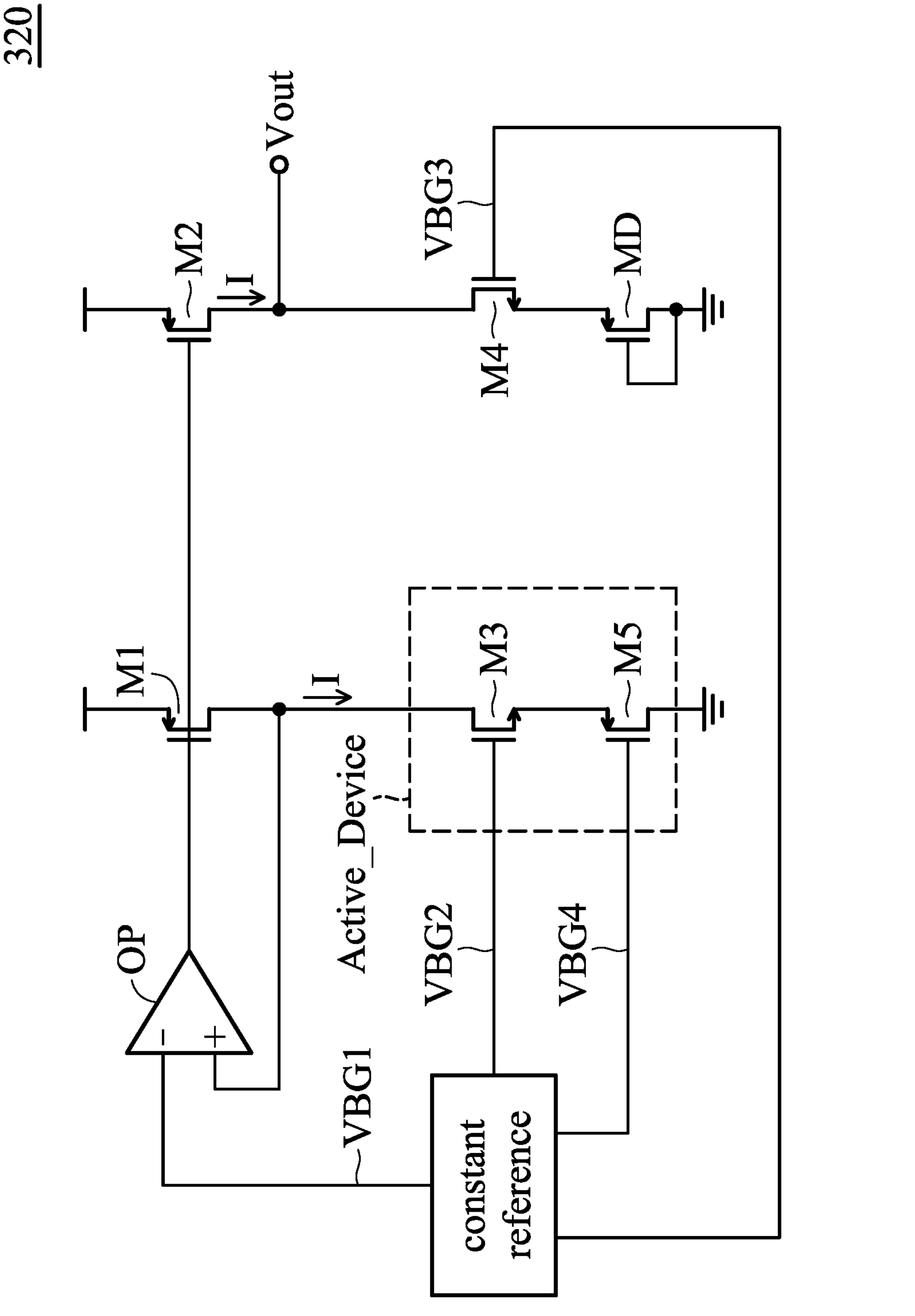
FIG. 3B illustrates a Vth sensor 320 in accordance with another exemplary embodiment of the present invention.

FIG. 3B illustrates a Vth sensor 320 in accordance with another exemplary embodiment of the present invention. In comparison with the Vth sensor 310, the Vth sensor 320 uses PMOSs to implement the fifth MOSFET M5 and the diode connected MOSFET MD. By controlling the constant voltages VBG1~VBG4, the third MOSFET M3, the fourth MOSFET M4, and the diode-connected MOSFET MD are operated in a saturation region, and the fifth MOSFET M5 is operated in a linear region. The non-ideal factor λ is successfully removed from the sensed Vth.

In some exemplary embodiments, VBG1=VBG2=VBG3, and VBG4 may equal VB2 or not.

In some exemplary embodiments, VBG2=VBG3>VBG1, and VBG4 may equal VB2 or not.

Figure 4A:
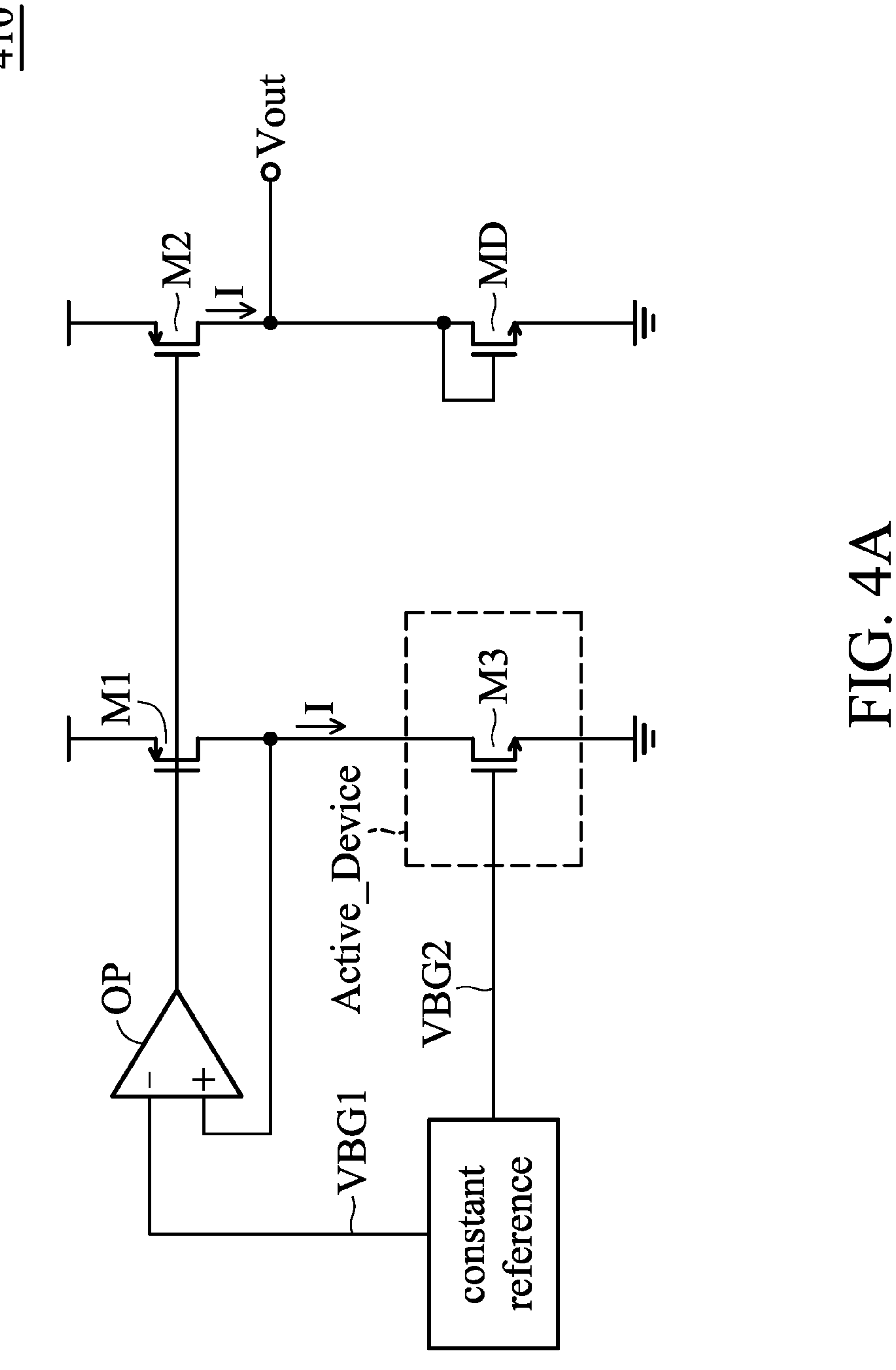
FIG. 4A illustrates a Vth sensor 410 in accordance with another exemplary embodiment of the present invention.

FIG. 4A illustrates a Vth sensor 410 in accordance with another exemplary embodiment of the present invention. The active device Active_Device is simple, only contains the third MOSFET M3. The third MOSFET M3 and the diode connected MOSFET MD are NMOSs. The third MOSFET M3 and the diode-connected MOSFET MD have the same length-to-width ratio.

Figure 4B:
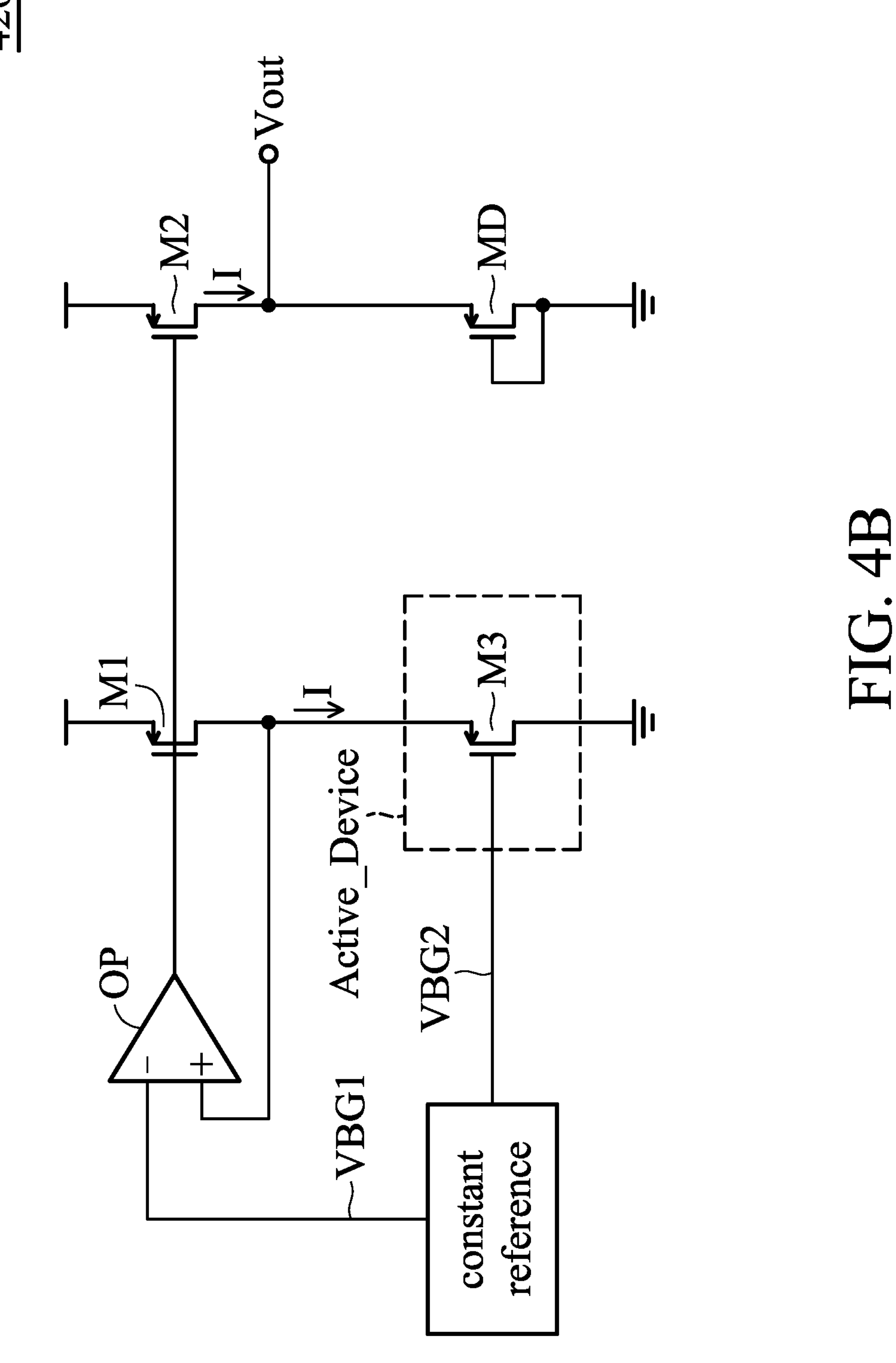
FIG. 4B illustrates a Vth sensor 420 in accordance with another exemplary embodiment of the present invention.

FIG. 4B illustrates a Vth sensor 420 in accordance with another exemplary embodiment of the present invention. In comparison with the Vth sensor 410, the Vth sensor 420 uses PMOSs to implement the third MOSFET M3 and the diode connected MOSFET MD. The third MOSFET M3 and the diode-connected MOSFET MD have the same length-to-width ratio.

Any Vth sensor using an active device to determine the constant current to be mirrored for generation of the output voltage Vout that contains the Vth information, should be regarded as within the scope of the present invention.

Figure 5:
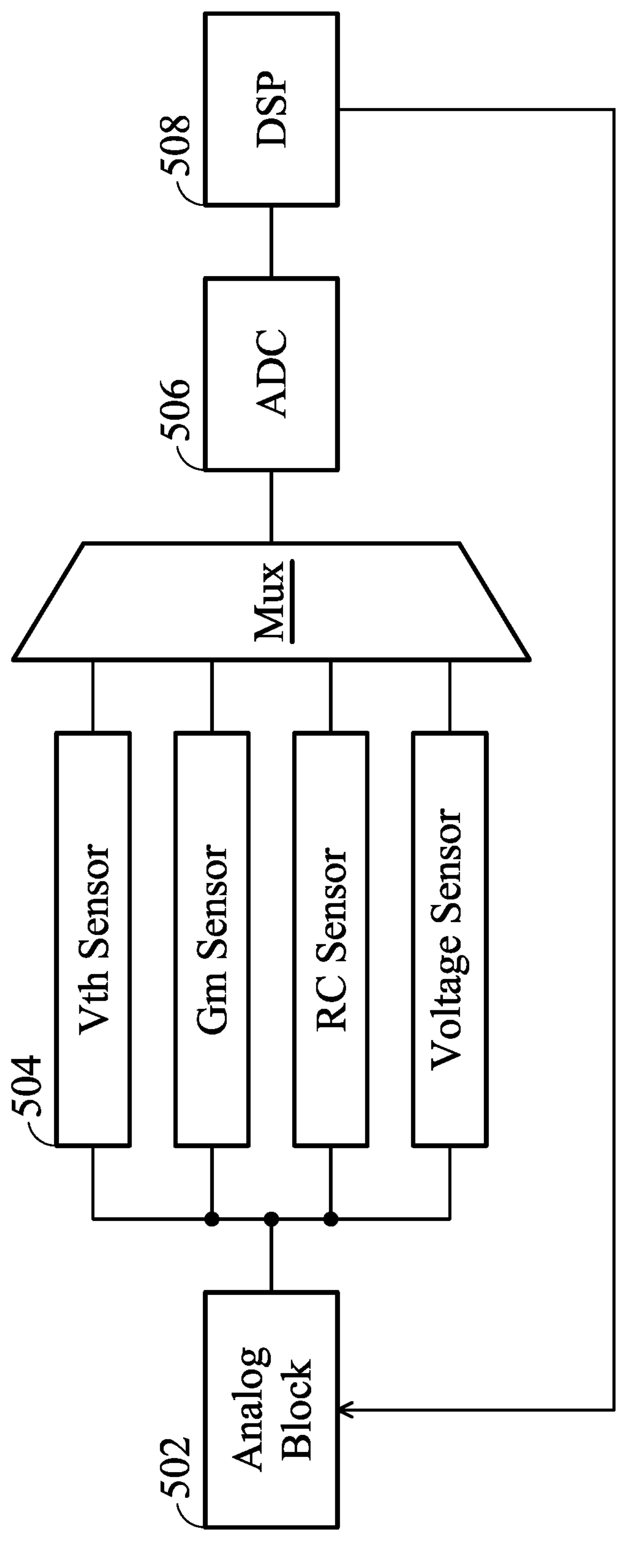
FIG. 5 illustrates a chip 500 in accordance with an exemplary embodiment of the present invention.

FIG. 5 illustrates a chip 500 in accordance with an exemplary embodiment of the present invention.

The chip 500 has an analog block 502. Within a surrounding area of the analog block 502 (e.g., in a predetermined distance, or in the same design), there may have various sensors, including the aforementioned Vth sensor 504. Through a multiplexer Mux, the sensed results (including the output voltage Vout generated by the Vth sensor 504) are converted into the digital form by an analog-to-digital converter (ADC) 506. Based on a digital value that the analog-to-digital converter 506 converts from the output voltage of the Vth sensor 504, the digital signal processor 508 performs a calibration process for the analog block 502. The Vth sensor 504 is simple and low cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A threshold voltage sensor, comprising:

a first metal-oxide-semiconductor field-effect transistor (MOSFET), a second MOSFET, and an operational amplifier, wherein the operational amplifier has an output terminal coupled to a gate terminal of the first MOSFET and a gate terminal of the second MOSFET, a first input terminal receiving a first constant voltage, and a second input terminal coupled to a drain terminal of the first MOSFET;

an active device, coupled between the drain terminal of the first MOSFET and a ground terminal to determine a constant current that is mirrored from the first MOSFET to the second MOSFET, wherein the active device comprises a third MOSFET coupled between the drain terminal of the first MOSFET and the ground terminal, and the third MOSFET has a gate terminal biased by a second constant voltage;

a diode-connected MOSFET, coupled between a drain terminal of the second MOSFET and the ground terminal; and a fourth MOSFET, coupled in series with the diode-connected MOSFET, and having a gate terminal biased by a third constant voltage;

wherein the constant current flows through the diode-connected MOSFET to generate an output voltage that contains information about a threshold voltage of the diode-connected MOSFET.

2. The threshold voltage sensor as claimed in claim 1, wherein:

the active device further comprises a first series of MOSFETs coupled between a source terminal of the third MOSFET and the ground terminal.

3. The threshold voltage sensor as claimed in claim 2, further comprising:

a second series of MOSFETs coupled between a source terminal of the fourth MOSFET and the ground terminal;

wherein the drain terminal of the second MOSFET is coupled to a drain terminal of the fourth MOSFET through the diode-connected MOSFET.

4. The threshold voltage sensor as claimed in claim 3, wherein:

the third MOSFET and the diode-connected MOSFET have the same length-to-width ratio;

the third MOSFET and the fourth MOSFET are the same size; and the size and number of the first series of MOSFETs are the same as the size and number of the second series of MOSFETs.

5. The threshold voltage sensor as claimed in claim 4, wherein:

gate terminals of the first series of MOSFETs are biased by the second constant voltage; and gate terminals of the second series of MOSFETs are biased by the third constant voltage.

6. The threshold voltage sensor as claimed in claim 5, wherein:

the first constant voltage equals the second constant voltage which equals the third constant voltage; and the third MOSFET and the fourth MOSFET are operated in a saturation region.

7. The threshold voltage sensor as claimed in claim 5, wherein:

the second constant voltage equals the third constant voltage, and is greater than the first constant voltage; and the third MOSFET and the fourth MOSFET are operated in a linear region.

8. The threshold voltage sensor as claimed in claim 1, further comprising:

a fifth MOSFET, coupled in series with the third MOSFET, and having a gate terminal biased by a fourth constant voltage.

9. The threshold voltage sensor as claimed in claim 8, wherein:

the first constant voltage equals the second constant voltage which equals the third constant voltage; and the third MOSFET, the fourth MOSFET, and the diode-connected MOSFET MD are operated in a saturation region, and the fifth MOSFET is operated in a linear region.

10. The threshold voltage sensor as claimed in claim 8, wherein:

the second constant voltage equals the third constant voltage, and is greater than the first constant voltage; and the third MOSFET, the fourth MOSFET, and the diode-connected MOSFET MD are operated in a saturation region, and the fifth MOSFET is operated in a linear region.

11. The threshold voltage sensor as claimed in claim 8, wherein:

the fifth MOSFET is an n-channel MOSFET (NMOS);

the third MOSFET and fourth MOSFET are NMOSs; and the diode connected MOSFET is implemented by an NMOS and is coupled between a source terminal of the fourth MOSFET and the ground terminal.

12. The threshold voltage sensor as claimed in claim 11, wherein:

the first bias voltage, second bias voltage, third bias voltage, and fourth bias voltage make the third MOSFET, the fourth MOSFET, and the diode-connected MOSFET operating in a saturation region, and the fifth MOSFET operating in a linear region.

13. The threshold voltage sensor as claimed in claim 8, wherein:

the fifth MOSFET is a p-channel MOSFET (PMOS);

the third MOSFET and fourth MOSFET are NMOSs; and the diode connected MOSFET is implemented by a PMOS and is coupled between a source terminal of the fourth MOSFET and the ground terminal.

14. The threshold voltage sensor as claimed in claim 13, wherein:

the first bias voltage, second bias voltage, third bias voltage, and fourth bias voltage make the third MOSFET, the fourth MOSFET, and the diode-connected MOSFET operating in a saturation region, and the fifth MOSFET operating in a linear region.

15. The threshold voltage sensor as claimed in claim 1, wherein:

the third MOSFET is an NMOS; and the diode connected MOSFET is implemented by an NMOS.

16. The threshold voltage sensor as claimed in claim 1, wherein:

the third MOSFET is a PMOS;

the diode connected MOSFET is implemented by a PMOS.

17. A chip, comprising:

an analog block;

the threshold voltage sensor as claimed in claim 1, placed within a surrounding area of the analog block;

an analog-to-digital converter, converting the output voltage generated by the threshold voltage sensor to a digital value; and a digital signal processor, performing a calibration process for the analog block based on the digital value.

* * * * *